(12) United States Patent
Choi

(10) Patent No.: US 6,538,944 B2
(45) Date of Patent: Mar. 25, 2003

(54) SEMICONDUCTOR MEMORY DEVICE HAVING A WORD LINE ENABLE SENSING CIRCUIT

(75) Inventor: Jin Hyeok Choi, Kyoungki-do (KR)

(73) Assignee: Hynix Semiconductor Inc., Ichon-shi (KR)

( * ) Notice: Subject to any disclaimer, the term of this patent is extended or adjusted under 35 U.S.C. 154(b) by 0 days.

(21) Appl. No.: 10/020,578

(22) Filed: Dec. 18, 2001

(65) Prior Publication Data

US 2002/0088960 A1 Jul. 11, 2002

(30) Foreign Application Priority Data

Dec. 20, 2000 (KR) .......................................... 2000-79093

(51) Int. Cl.$^7$ ................................................ G11C 7/00
(52) U.S. Cl. ........................ 365/205; 365/207; 365/208
(58) Field of Search ................................. 365/198, 205, 365/207, 208, 194, 230.06

(56) References Cited

U.S. PATENT DOCUMENTS

| 5,291,447 | A | * | 3/1994 | Komada et al. | ............ 365/207 |
| 5,724,293 | A | * | 3/1998 | Tomishima et al. | ......... 365/207 |
| 5,946,253 | A | * | 8/1999 | Fujiwara | ..................... 365/207 |
| 6,041,004 | A | * | 3/2000 | Haga | .......................... 365/207 |
| 6,052,324 | A | * | 8/2000 | Tobita | ........................ 365/207 |

* cited by examiner

Primary Examiner—Trong Phan
(74) Attorney, Agent, or Firm—Jacobson Holman PLLC

(57) ABSTRACT

A semiconductor memory device having a word line enable sensing block for driving sense amplifiers only when a word line is enabled. In this way, an enable time point of the sense amplifiers is controlled according to variations in operating conditions such as a temperature, process, voltage and size of a memory cell. In addition, the semiconductor memory device can embody an embedded memory logic.

12 Claims, 4 Drawing Sheets

SEMICONDUCTOR MEMORY DEVICE HAVING A WORD LINE ENABLE SENSING CIRCUIT

BACKGROUND OF THE INVENTION

1. Field of the Invention

The present invention relates to a semiconductor memory device, and in particular to an improved semiconductor memory device which can drive sense amplifiers according to variations in operating conditions, by using a word line enable sensing block for outputting a sense amplifier driver control signal at an enable time point of a word line.

2. Description of the Background Art

FIG. 1 is a circuit diagram illustrating a conventional semiconductor memory device.

The conventional semiconductor memory device includes: a memory cell array 2 having a plurality of memory cells 1; a sense amplifier driver control circuit 3; a sense amplifier driver 4; and a sense amplifier array 6 having a plurality of sense amplifiers 5.

The memory cell array 2 includes the plurality of memory cells 1 having an array structure, each memory cell being aligned in cross points of word lines and bit lines. Each memory cell 1 includes a cell plate voltage VCP and a cell transistor TRC for transferring data stored in a storage capacitor CS to the bit.

The sense amplifier block 6 includes the plurality of sense amplifiers 5 for receiving data from the bit lines, and amplifying the received data.

The operation of the conventional semiconductor memory device will now be explained.

When a row address strobe signal RAS is generated and one of the word lines of the memory cell array 2 is enabled in a high level, the cell transistors TRC of the memory cells 1 connected to the enabled word line are turned on, thereby charge-distributing the data stored in the storage capacitor CS to the bit lines. As is known in the art, the row address strobe signal is an outside control signal for controlling the enable time of the word lines.

On the other hand, the sense amplifier driver control circuit 3 outputs a sense amplifier driver operation control signal CON after a predetermined time from generation of the row address strobe signal RAS according to a delay timing defined in design. And, the sense amplifier driver 4 receives the sense amplifier driver operation control signal CON and outputs sense amplifier enable signals RTO and /S for enabling the sense amplifiers 5.

The sense amplifier enable signals RTO and /S from the sense amplifier driver 4 enable the sense amplifiers 5, and the enabled sense amplifiers 5 amplify the data from the corresponding bit lines.

Now, a time interval between generation of the row address strobe signal RAS and completion of the enable operation of the word line is varied according to various conditions of the memory device such as an operation voltage, process variation and operation temperature of the memory device, and a size and number of the memory cell blocks. Therefore, a variation width of the word line enable time must be considered to decide the enable timing of the sense amplifiers 5.

However, when the conventional semiconductor memory device controls the enable timing of the sense amplifiers 5, the sense amplifier driver control circuit 3 outputs the sense amplifier driver operation control signal CON after a predetermined time from generation of the row address strobe signal RAS to drive the sense amplifier driver 4. The delay time between generation of the row address strobe signal RAS and generation of the sense amplifier driver operation control signal CON is decided by a test in design.

Accordingly, the sense amplifier driver control circuit 3 is designed to output the sense amplifier driver operation control signal CON pursuant to the latest enable time of the word line in consideration of variations of the word line enable time.

When the semiconductor memory device is operated according to the latest enable completion time, an operation time is unnecessarily increased in every operation. It is thus difficult to perform a high speed operation.

In an embedded memory logic (EML) where a memory cell and a logic are integrated in one chip, operation conditions and a number and size of the memory cell arrays are varied according to uses of the logic. Here, the sense amplifier driver control circuits should have been designed to take into account all variations of the operation conditions. As a result, it is difficult to apply the conventional semiconductor memory device to the EML.

SUMMARY OF THE INVENTION

Accordingly, it is a primary object of the present invention to improve an operation speed of a semiconductor memory device, by reflecting variations of a word line enable timing due to variations of operation conditions after design, such as an operation voltage, process and operation temperatures, to driving of sense.

Another object of the present invention is to simplify an EML design by automatically considering variations of operation conditions in accordance with uses of a logic, and variations of a word line enable timing in accordance with a number and size of memory cell blocks.

In order to achieve the above-described objects of the invention, there is provided a semiconductor memory device including: at least one memory block having a memory cell array composed of a plurality of memory cells each aligned in cross point of word line and bit line, and a sense amplifier array composed of a plurality of sense amplifiers for amplifying data from the plurality of memory cells; a word line sensing means for sensing an enable state of the word lines and transmitting a predetermined voltage to a sense amplifier driver; and the sense amplifier driver for driving the sense amplifiers of the memory block according to the predetermined voltage from the word line sensing means.

BRIEF DESCRIPTION OF THE DRAWINGS

The present invention will become better understood with reference to the accompanying drawings which are given only by way of illustration and thus are not limitative of the present invention, wherein.

DETAILED DESCRIPTION OF THE PREFERRED EMBODIMENTS

A semiconductor memory device in accordance with a preferred embodiment of the present invention will now be described in detail with reference to the accompanying drawings.

Figure 1:
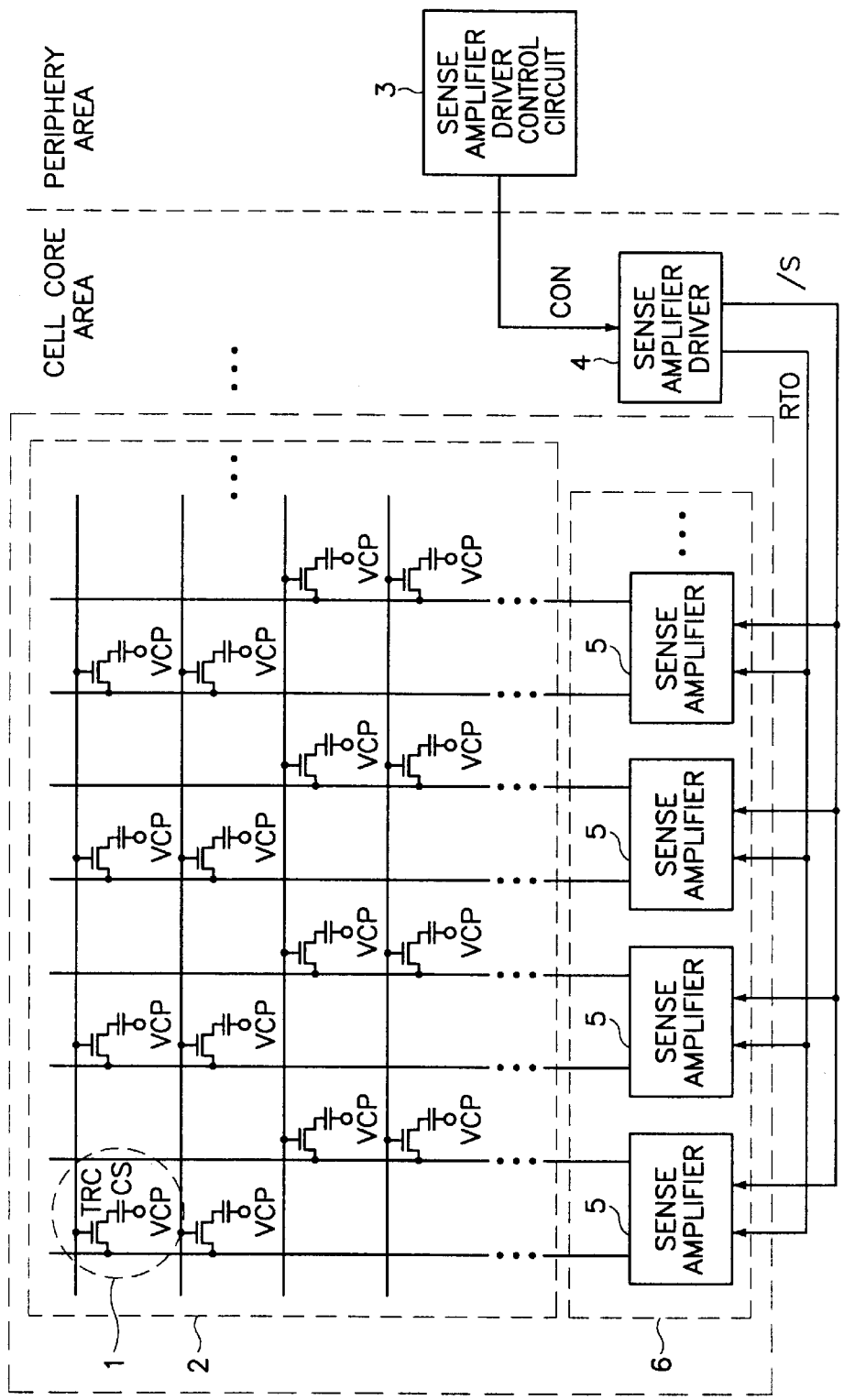
FIG. 1 is a circuit diagram illustrating a conventional semiconductor memory device.
Figure 2:
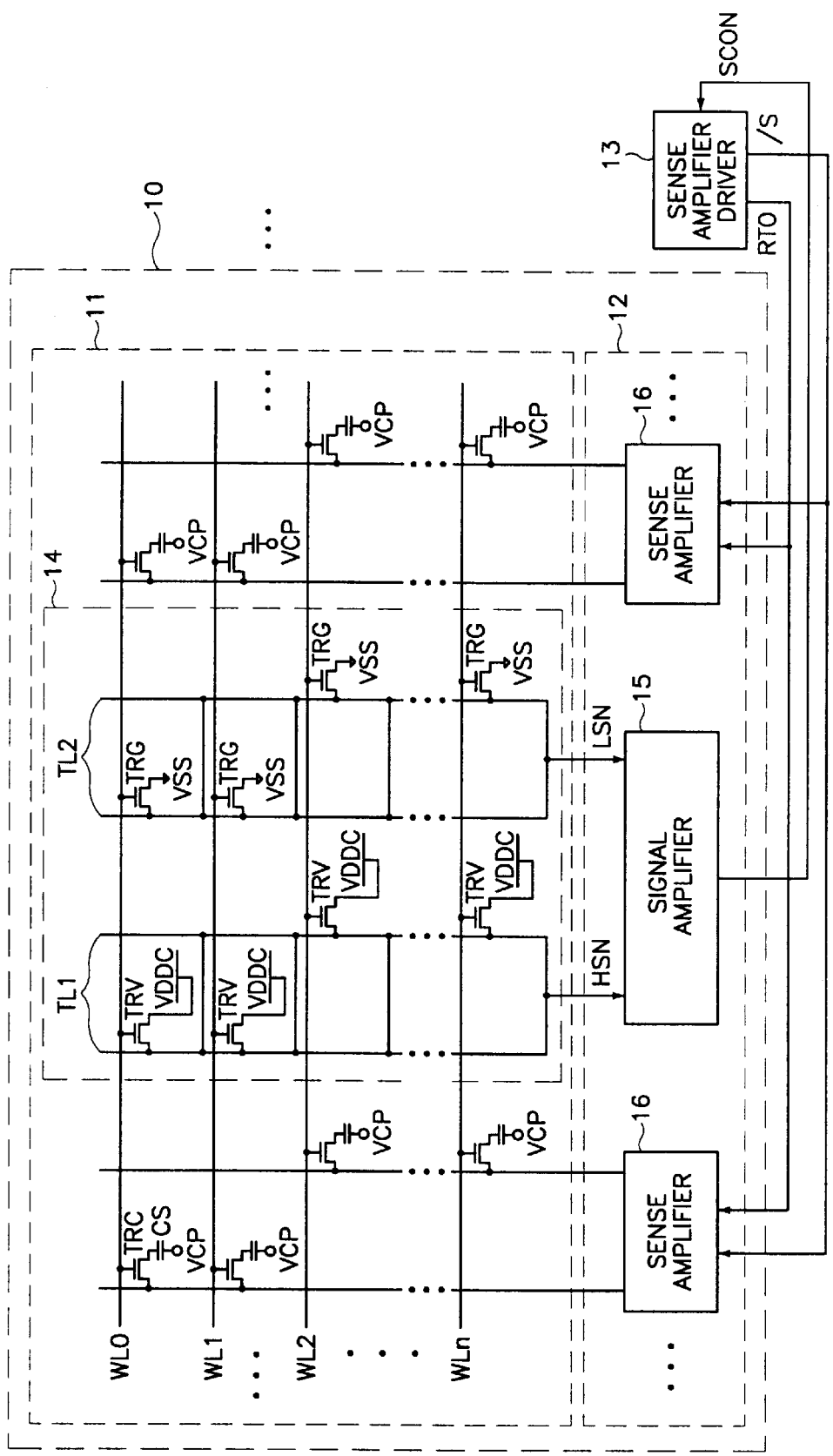
FIG. 2 is a circuit diagram illustrating a specific memory block having a sensing unit in a semiconductor memory device in accordance with the present invention.

FIG. 2 is a circuit diagram illustrating the semiconductor memory device having the sensing unit of the present invention.

The semiconductor memory device comprises a plurality of memory blocks 10, each memory block 10 having a memory cell array 11 composed of a plurality of memory cells aligned in cross points of word lines WL0–WLn and bit lines, a sense amplifier array 12 composed of a plurality of sense amplifiers 16, a sense amplifier driver 13 in one among a plurality of memory blocks, a sensing unit 14 for sensing a word line enable state and a signal amplifier 15 for amplifying output signals HSN and LSN from the sensing unit 14.

Referring to FIG. 2, the sensing unit 14 is formed in the middle portion of the memory cell array 11. The signal amplifier 15 is formed in the middle portion of the sense amplifier array 12 positioned in a cell core area. A high level transmission line TL1, and a low level transmission line TL2 are formed in the sensing unit 14. Sensing transistors TRV and TRG are formed in the same manner as the memory cell transistors TRC of the memory cell array 11. Sensing transistors TRV are formed in a cross region of the high level transmission line TL1 and the word lines and sensing transistors TRG are formed in a cross region of the low level transmission line TL2 and the word lines. When the word line is enabled, the sensing transistor TRV of the sensing unit 14 transmits a cell core voltage VDDC to the high level transmission line TL1. When the word line is enabled, the sensing transistor TRG transmits a ground voltage VSS to the low level transmission line TL2.

Here, the high level transmission line TL1 and the low level transmission line TL2 formed in a manner identically to the bit line pairs each is composed of two lines whose ends are connected. When the word line is enabled, the two lines are electrically connected to improve a transmission speed.

When the word line is enabled, the sensing transistors TRV and TRG of the sensing unit 14 are turned on to respectively transmit the cell core voltage VDDC and the ground voltage VSS to the high level transmission line TL1 and the low level transmission line TL2, thereby outputting a high level sensing signal HSN and a low level sensing signal LSN.

Figure 3:
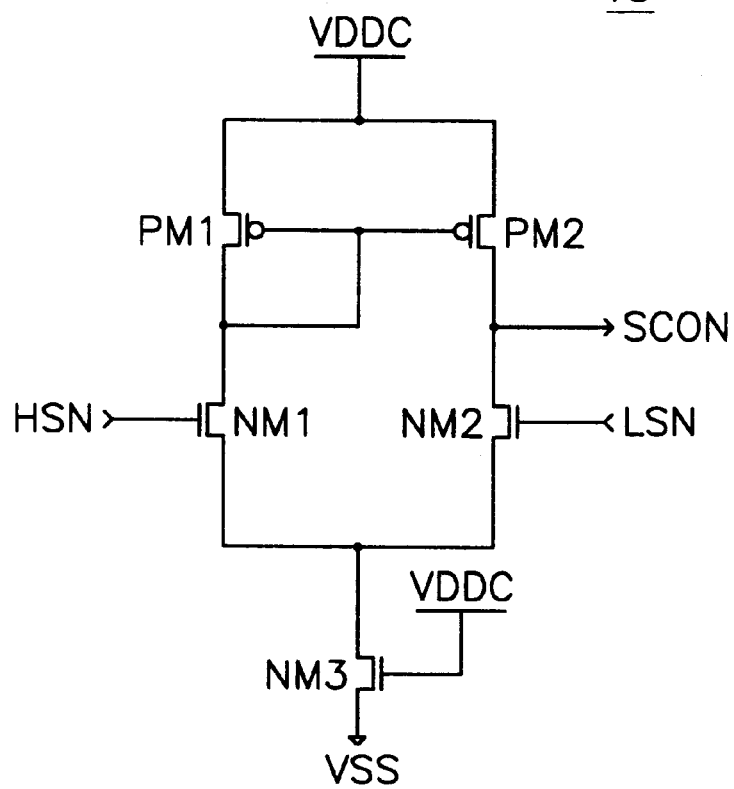
FIG. 3 is a detailed circuit diagram illustrating a signal amplifier in the semiconductor memory device of FIG. 2.

FIG. 3 is a detailed circuit diagram illustrating the signal amplifier 15 in the semiconductor memory device of FIG. 2. Here, a differential amplifier is used as the signal amplifier 15.

As illustrated in FIG. 3, the signal amplifier 15 includes: a PMOS transistor PM2 having its source connected to receive the cell core voltage VDDC; a PMOS transistor PM1 having its gate and drain commonly connected and its gate commonly connected to the gate of the PMOS transistor PM2; NMOS transistors NM1 and NM2 having their drains connected respectively to the drains of the PMOS transistors PM1 and PM2, and their gates connected to respectively receive the high sensing signal HSN and the low sensing signal LSN; and an NMOS transistor NM3 having its drain connected to the commonly-connected sources of the NMOS transistors NM1 and NM2, its source connected to the ground voltage VSS, and its gate connected to the cell core voltage VDDC. A driver control signal SCON is outputted from the commonly-connected drains of the PMOS transistor PM2 and the NMOS transistor NM2.

The signal amplifier 15 receives the high sensing signal HSN and the low sensing signal LSN through a non-inverting input terminal and an inverting-input terminal and amplifies a voltage difference between the two signals HSN and LSN, and then outputs the driver control signal SCON.

Figure 4:
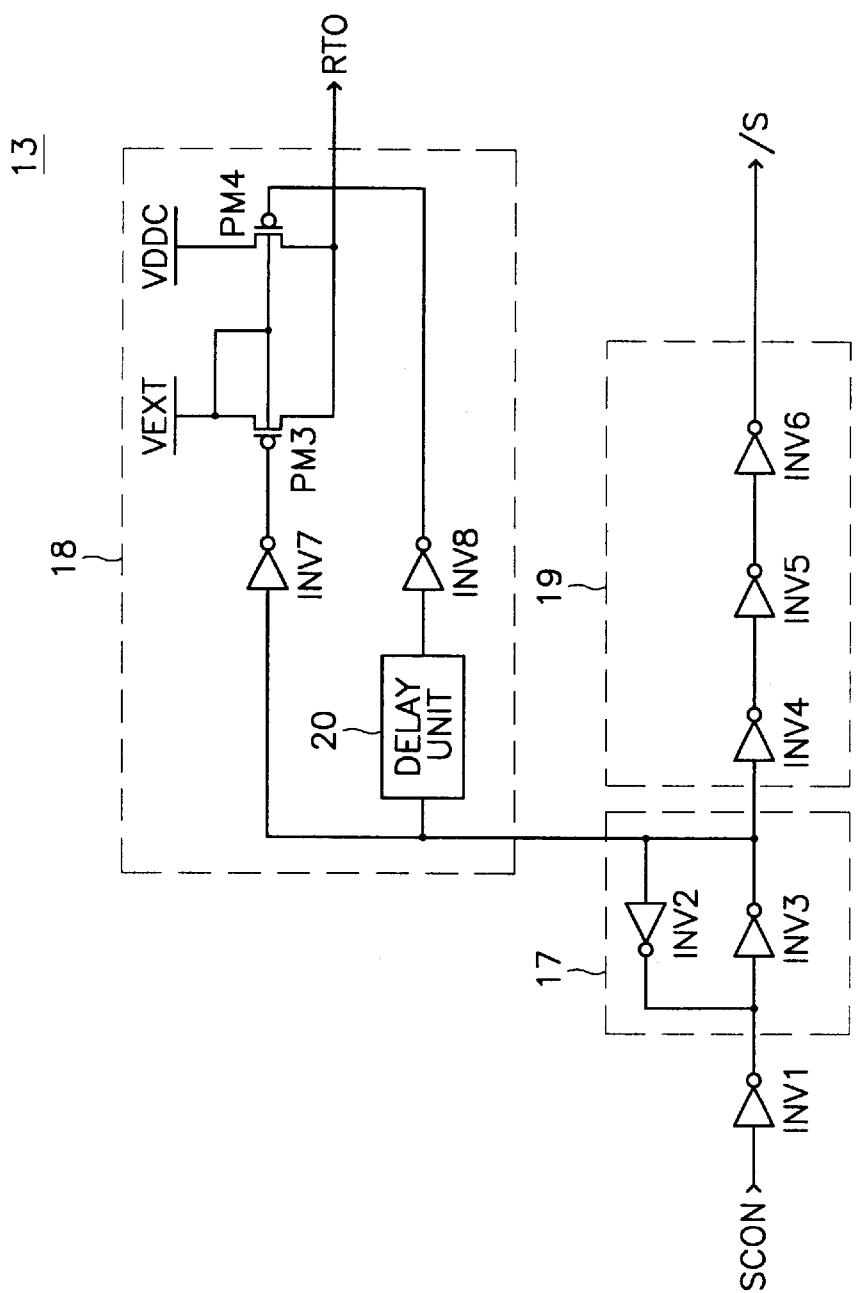
FIG. 4 is a detailed circuit diagram illustrating a sense amplifier driver in the semiconductor memory device of FIG. 2.

FIG. 4 is a detailed circuit diagram illustrating the sense amplifier driver 13.

As depicted in FIG. 4, the sense amplifier driver 13 includes: a latch unit 17 for latching the driver control signal SCON; a high enable signal generating unit 18; and a low enable signal generating unit 19. The sense amplifier driver 13 receives the driver control signal SCON, and outputs a high enable signal RTO and a low enable signal /S for enabling the sense amplifiers to the sense amplifiers 16 of the sense amplifier array 12.

The latch unit 17 is an inverting latch having two inverters INV2 and INV3. The latch unit 17 receives an inverted signal of the driver control signal SCON by the inverter IV1, and latches the received signal.

The high enable signal generating unit 18 includes: a delay unit 20 for delaying the signal latched in the latch unit 17 for a predetermined time; a PMOS transistor PM3, its gate receiving an inverted signal of the output signal from the latch unit 17 by an inverter INV7, for outputting an external power voltage VEXT in form of the high enable signal RTO; and a PMOS transistor PM4, its gate receiving an inverted signal of the output signal from the delay unit 20 by an inverter INV8, for outputting the cell core voltage VDDC in form of the high enable signal RTO.

The low enable signal generating unit 19 includes three inverters INV4, INV5 and INV6, sequentially inverts the output signal from the latch unit 17, and outputs the low enable signal /S.

The sense amplifier 16 receives the high enable signal RTO and the low enable signal /S from the sense amplifier driver 13, and amplifies the data from the bit lines. The sense amplifier 16 has the general constitution, and thus detailed drawings and explanations are omitted.

The operation of the semiconductor memory device in accordance with the present invention will now be described.

When one word line WL0 is enabled, the plurality of cell transistors TRC connected to the enabled word line WL0 and the sensing transistors TRV and TRG of the sensing unit 14 are turned on.

The respective cell transistors TRC connected to the word line WL0 switch and output the data stored in the storage capacitor CS to the bit lines. The sensing transistors TRV and TRG connected to the word line WL0 respectively switch the cell core voltage VDDC and the ground voltage VSS to the high level transmission line TL1 and the low level transmission line TL2.

The data switched to the bit lines are transmitted to the sense amplifiers 16, and the cell core voltage VDDC switched to the high level transmission line TL1 in the sensing unit 14 and the ground voltage VSS switched to the low level transmission line TL2 are respectively transmitted to the signal amplifier 15 as the high sensing signal HSN and the low sensing signal LSN.

Here, the high level transmission line TL1 and the low level transmission line TL2 each includes two lines connected to each other, and thus have a smaller line resistance than the bit lines transmitting data to the sense amplifiers 16, which results in a high data transmission speed. Accordingly, the high sensing signal HSN and the low sensing signal LSN are transmitted to the signal amplifier 15 before the data are transmitted to the sense amplifiers 16 through the bit lines.

The high sensing signal HSN having a high level and the low sensing signal LSN having a low level are inputted respectively to the non-inverting input terminal and the inverting input terminal of the signal amplifier 15. The signal amplifier 15 amplifies the voltage difference between the two signals HSN and LSN, and outputs the high level driver control signal SCON.

The sense amplifier driver 13 receives the high level driver control signal SCON, and the latch unit 17 inverts and latches the low level signal obtained by inverting the high level driver signal SCON by the inverter INV, and outputs the high level signal to the low enable signal generating unit 18 and the high enable signal generating unit 19.

The low enable signal generating unit 19 receives the signal latched by the latch unit 17, sequentially inverts the received signal, and outputs the low enable signal /S.

In the high enable signal generating unit 18, the high level signal from the latch unit 17 is inverted by the inverter INV7 and inputted to the gate of the PMOS transistor PM3 to turn on the PMOS transistor PM3, thereby outputting the external power voltage VEXT as the high enable signal RTO. In addition, the high level signal is inverted and delayed by the inverter INV8 and the delay unit 20, and inputted to the gate of the PMOS transistor PM4 to turn on the PMOS transistor PM4, thereby outputting the cell core voltage VDDC as the high enable signal RTO. That is, the high enable signal RTO is outputted by using the external power voltage VEXT, and then maintained with the cell core voltage VDDC after a predetermined delay.

When the high enable signal RTO and the low enable signal /S from the sense amplifier driver 13 are inputted to the sense amplifiers 16 of the sense amplifier array 12 to enable the sense amplifiers 16, the respective sense amplifiers 16 sense and amplify the data from the bit lines.

As described above, the semiconductor memory device of the present invention senses enabling of the word line WL0 by the sensing unit 14, and outputs the sense amplifier driver operation control signal SCON. Therefore, the sense amplifiers 16 are driven by considering variations of a time delay width between generation of the row address strobe signal RAS and enabling of the word line due to variations of the operation conditions such as the number and size of the memory cell arrays, operation temperature, process and operation voltage.

It is thus possible to prevent an operation delay generated because the sense amplifiers are driven after a delay time based on the latest enable time of the word line after generation of the row address strobe signal RAS. In the semiconductor memory device having the plurality of memory blocks, only one memory block 10 includes the sensing unit 14 having the same constitution as the memory cell array. Accordingly, a chip area is reduced and the whole process is simplified.

In this embodiment, the sensing unit 14 is formed in the middle portion of the memory cell array 11 of the memory block 10. However, the sensing unit 14 may be formed at the end portion of the memory cell array 11. That is, the sensing unit 14 must be formed in one of the memory cell arrays 11 of the memory block 10.

When the output signals HSN and LSN from the sensing unit 14 are strong, the signal amplifier 15 can be formed in a periphery area or included in the sense amplifier driver 13 in the cell core area. In addition, both the signal amplifier 15 and the sense amplifier driver 13 can be formed in the periphery area.

Here, when the signal amplifier 15 is formed in the periphery area, a power voltage VDDperi used for a periphery circuit is transmitted as a driving voltage.

When the output signals HSN and LSN are sufficiently strong, the signals HSN and LSN can be directly transmitted to the sense amplifier driver 13 to output the sense amplifier enable signals RTO and /S, instead of using the signal amplifier 15.

Such constitution can be used for a flash memory or SRAM having strong internal signals.

In this embodiment, the sensing unit 14 is formed in the memory cell array 11. However, the sensing unit 14 of the semiconductor memory device controls the sense amplifiers 16 by sensing the enable time point of the word line, and outputting the sense amplifier driver operation control signal SCON. Accordingly, the sensing unit 14 can be separately formed from the memory cell array 11. It is clear to those skilled in the art that such constitution does not depart from the spirit or essential characteristics of the present invention.

As discussed earlier, in accordance with the present invention, the sense amplifiers are enabled by sensing the enable time point of the word line, and thus driven by considering variations of the time delay width between generation of the row address strobe signal and enabling of the word line due to variations of the operation conditions such as the number and size of the memory cell arrays, operation temperature, process and operation voltage.

Whenever the word line is enabled, variations of the operation conditions such as the operation temperature, process and operation voltage are reflected to driving of the sense amplifiers, thereby achieving the high speed operation of the semiconductor memory device.

Moreover, it is not necessary to form the optimal sense amplifier driver control circuit in consideration of the operation conditions on design and probable variations thereof. Accordingly, the semiconductor memory device can be more easily designed.

Especially, in the EML, it is not required to form the sense amplifier driver control circuits corresponding to all variations of the operation conditions due to difference of the operation conditions in every logic and the number and size of the memory cells. As a result, the EML memory macro design is more simplified.

As the present invention may be embodied in several forms without departing from the spirit or essential characteristics thereof, it should also be understood that the above-described embodiment is not limited by any of the details of the foregoing description, unless otherwise specified, but rather should be construed broadly within its spirit and scope as defined in the appended claims, and therefore all changes and modifications that fall within the metes and bounds of the claims, or equivalences of such metes and bounds are therefore intended to be embraced by the appended claims.

What is claimed is:

1. A semiconductor memory device comprising:
    at least one memory block having a memory cell array composed of a plurality of memory cells having cell transistors therein;
    a sense amplifier array composed of a plurality of sense amplifiers for amplifying data of the plurality of memory cells;

a word line sensing means for sensing an enable state of word lines, and outputting a predetermined voltage upon sensing said enable state of word lines; and a sense amplifier driver for driving the sense amplifiers of the sense amplifier array according to the predetermined voltage received from the word line sensing means.

2. The device according to claim 1, wherein the word line sensing means comprises a plurality of switching means for transmitting a predetermined voltage through signal transmission lines to the sense amplifier driver when at least one word line is enabled.

3. The device according to claim 2, wherein the plurality of switching means are arranged in a manner similar to that of the cell transistors of the memory cells.

4. The device according to claim 2, wherein each signal transmission line is composed of two lines having their ends connected to each other, with the plurality of switching means connected alternatively to the two lines of the signal transmission line.

5. The device according to claim 3, wherein the signal transmission lines comprise:

a high level signal transmission line for transmitting a high level voltage; and a low level signal transmission line for transmitting a low level voltage.

6. The device according to claim 5, wherein the switching means comprise:

high level switching means for switching the high level voltage to the high level signal transmission line; and low level switching means for switching the low level voltage to the low level signal transmission line.

7. The device according to claim 3, wherein the signal transmission lines are electrically connected in word line units.

8. The device according to claim 1, wherein the word line sensing means is formed in an area where the memory cell array of the memory block is formed.

9. The device according to claim 1, wherein the word line sensing means further comprises a signal amplifier for amplifying the predetermined voltage and outputting it to the sense amplifier driver.

10. The device according to claim 9, wherein the signal amplifier is a differential amplifier.

11. The device according to claim 9, wherein the signal amplifier is formed in an area where the sense amplifier array of the memory block is formed.

12. The device according to claim 9, wherein the signal amplifier is formed in a region of the semiconductor memory device where the sense amplifier driver is formed.

* * * * *